(12) United States Patent
Yanagisawa et al.

(10) Patent No.: US 8,172,950 B2
(45) Date of Patent: May 8, 2012

(54) SUBSTRATE PROCESSING APPARATUS AND SEMICONDUCTOR DEVICE PRODUCING METHOD

(75) Inventors: Yoshihiko Yanagisawa, Toyama (JP); Mitsuro Tanabe, Toyama (JP)

(73) Assignee: Hitachi Kokusai Electric Inc., Tokyo (JP)

(*) Notice: Subject to any disclaimer, the term of this patent is extended or adjusted under 35 U.S.C. 154(b) by 963 days.

(21) Appl. No.: 11/990,696

(22) PCT Filed: Nov. 28, 2006

(86) PCT No.: PCT/JP2006/323692
§ 371 (c)(1), (2), (4) Date: Feb. 20, 2008

(87) PCT Pub. No.: WO2007/063838
PCT Pub. Date: Jun. 7, 2007

(65) Prior Publication Data
US 2009/0017641 A1    Jan. 15, 2009

(30) Foreign Application Priority Data
Nov. 30, 2005 (JP) .................. 2005-345873

(51) Int. Cl.
*H01L 21/30* (2006.01)
*F27D 11/00* (2006.01)

(52) U.S. Cl. .............. 118/725; 156/345.52; 438/795; 219/385

(58) Field of Classification Search .................. 118/725; 156/345.52, 345.27, 345.37; 438/795; 219/385
See application file for complete search history.

(56) References Cited

U.S. PATENT DOCUMENTS

| | | | | |
|---|---|---|---|---|
| 4,632,056 A | * | 12/1986 | Stitz et al. ............. | 118/712 |
| 5,870,526 A | * | 2/1999 | Aschner et al. ......... | 392/416 |
| 7,509,035 B2 | * | 3/2009 | Ranish et al. ........... | 392/416 |
| 2009/0017641 A1 | * | 1/2009 | Yanagisawa et al. ...... | 438/795 |

FOREIGN PATENT DOCUMENTS

| | | |
|---|---|---|
| JP | 61-131419 A | 6/1986 |
| JP | 7-130677 A | 5/1995 |
| JP | 2005-012141 A | 1/2005 |
| JP | 2005-101228 A | 4/2005 |

OTHER PUBLICATIONS

Machine Generated English Translation of JP2005-101228 published May 14, 2005.*

* cited by examiner

*Primary Examiner* — Sylvia R. MacArthur
(74) *Attorney, Agent, or Firm* — Birch, Stewart, Kolasch & Birch, LLP

(57) ABSTRACT

Disclosed is a substrate processing apparatus, including: a chamber, made of a metal, to form a processing space for processing a substrate; at least one rod-like heating body to heat the substrate; and a tube body, made of a material different from that of the chamber, to accommodate the heating body therein, wherein an outer diameter of the tube body on a processing space side in a penetrating portion where the tube body penetrates a wall of the chamber is set to be smaller than an outer diameter of the tube body on an outer side of the chamber in the penetrating portion.

8 Claims, 7 Drawing Sheets

SUBSTRATE PROCESSING APPARATUS AND SEMICONDUCTOR DEVICE PRODUCING METHOD

The present invention relates to a substrate processing apparatus and a semiconductor device producing method, and more particularly, to a semiconductor producing apparatus which heats a wafer using a rod-like lamp, and to a semiconductor device producing method using the semiconductor producing apparatus.

For example, an apparatus which heats a back face of a wafer using a rod-like lamp needs to shorten a distance between the wafer and the lamp in order to enhance the heating efficiency. When the rod-like lamp is disposed directly below the wafer, since the rod-like lamp itself has a problem with heat resistance in terms of a quartz tube and a sealing terminal portion of the rod-like lamp, it is difficult to heat the wafer under a low pressure when the rod-like lamp is disposed directly below the wafer if cooling of the terminal portion is taken into account. Moreover, when a cooling structure is provided in a chamber having the same low pressure as the wafer processing atmosphere and the lamp is disposed in the chamber, there is a possibility that metal contamination occurs because metals used in the terminal and the sealing portion of the lamp are exposed to the same atmosphere as that of the wafer. If the low pressure chamber and a rod-like lamp area of atmospheric pressure are isolated from each other by a quartz plate, the lamp can be cooled by air. However, if a pressure applied to the quartz plate at the time of vacuum is taken into account, the thickness of the quartz plate is increased and as a result, a distance between the wafer and the lamp is increased and the heating efficiency becomes worse.

To solve the problem, a patent application (Japanese Patent Application Laid-open No. 2005-101228) which discloses a structure for separating atmosphere and vacuum by providing a quartz tube which covers a rod-like lamp in a chamber is previously filed. However, when quartz tubes are disposed in a metallic chamber in a form of lattice, and the atmosphere and the vacuum are separated by separating insides of the quartz tubes and an inside of the chamber from each other, there is a problem that the metallic chamber itself is deformed and becomes warped owing to the thermal expansion difference due to difference in temperature inside and outside the chamber. As a result, a bending stress is generated in the quartz tube which is a brittle material, and the quartz tube is broken.

It is, therefore, a main object of the present invention to provide a substrate processing apparatus including a chamber which forms a processing space for processing a substrate and which is made of a metal; at least one rod-like heating body which heats the substrate; and a tube body in which the heating body is accommodated and which is made of material different from that of the chamber, wherein the tube body penetrates a wall of the chamber, to enable the substrate processing apparatus to prevent the tube body from being broken, and to provide a producing method of a semiconductor device using the substrate processing apparatus.

According to one aspect of the present invention, there is provided a substrate processing apparatus, comprising: a chamber, made of a metal, to form a processing space for processing a substrate;
at least one rod-like heating body to heat the substrate; and
a tube body, made of a material different from that of the chamber, to accommodate the heating body therein, wherein
an outer diameter of the tube body on a processing space side in a penetrating portion where the tube body penetrates a wall of the chamber is set to be smaller than an outer diameter of the tube body on an outer side of the chamber in the penetrating portion.

According to another aspect of the present invention, there is provided a producing method of a semiconductor device, comprising:
loading a substrate into a processing space of a substrate processing apparatus including: a chamber, made of a metal, to form a processing space for processing a substrate; at least one rod-like heating body to heat the substrate; and a tube body, made of a material different from that of the chamber, to accommodate the heating body therein, wherein an outer diameter of the tube body on a processing space side in a penetrating portion where the tube body penetrates a wall of the chamber is set to be smaller than an outer diameter of the tube body on an outer side of the chamber in the penetrating portion;
heating the processing space by the heating body accommodated in the tube body;
processing the substrate in the processing space; and
unloading the substrate from the processing space.

Next, preferred embodiments of the present invention will be explained with reference to the drawings.

Figure 1:
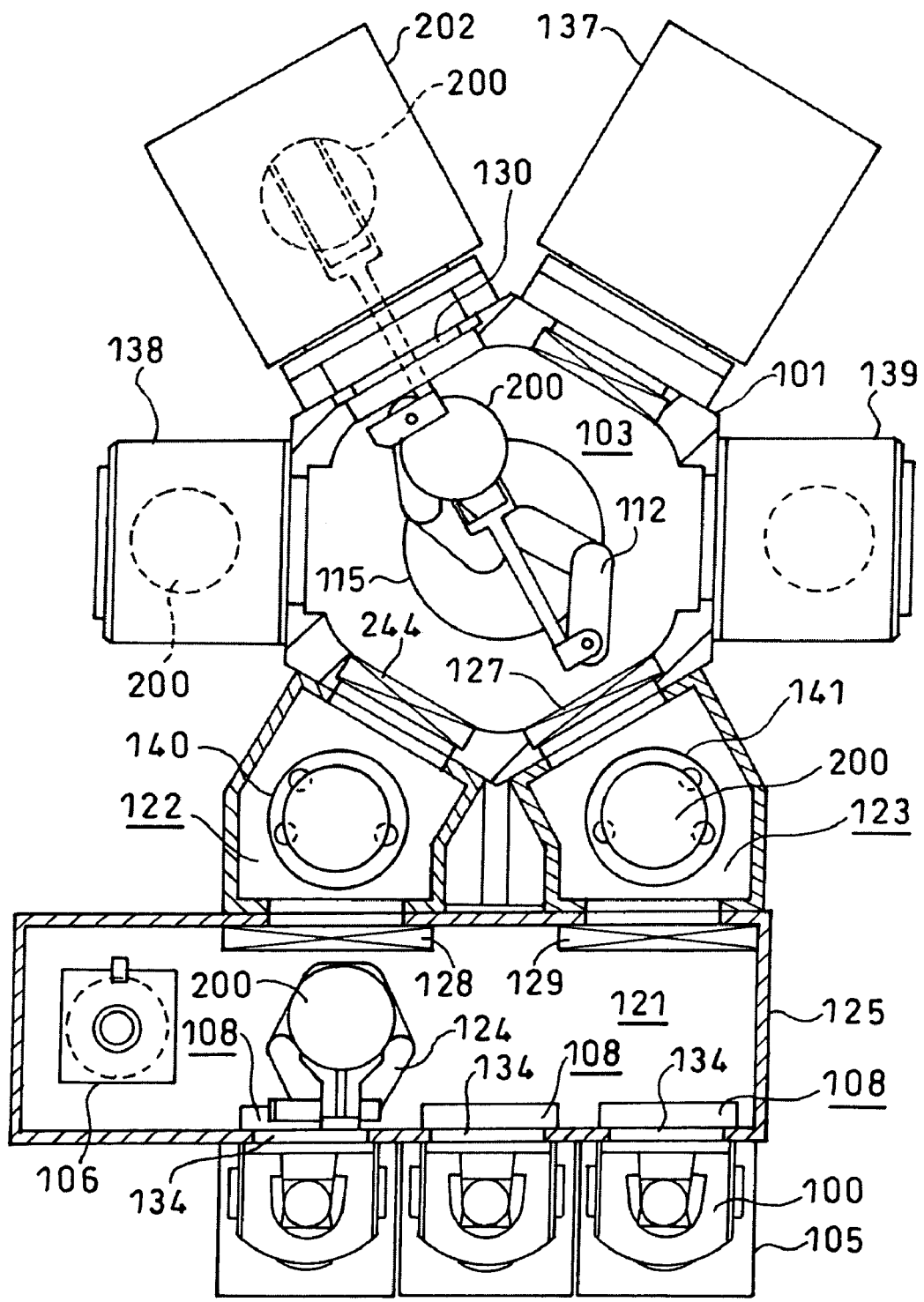
FIG. 1 is a schematic transverse sectional view for explaining a substrate processing apparatus according to preferred embodiments of the present invention.
Figure 2:
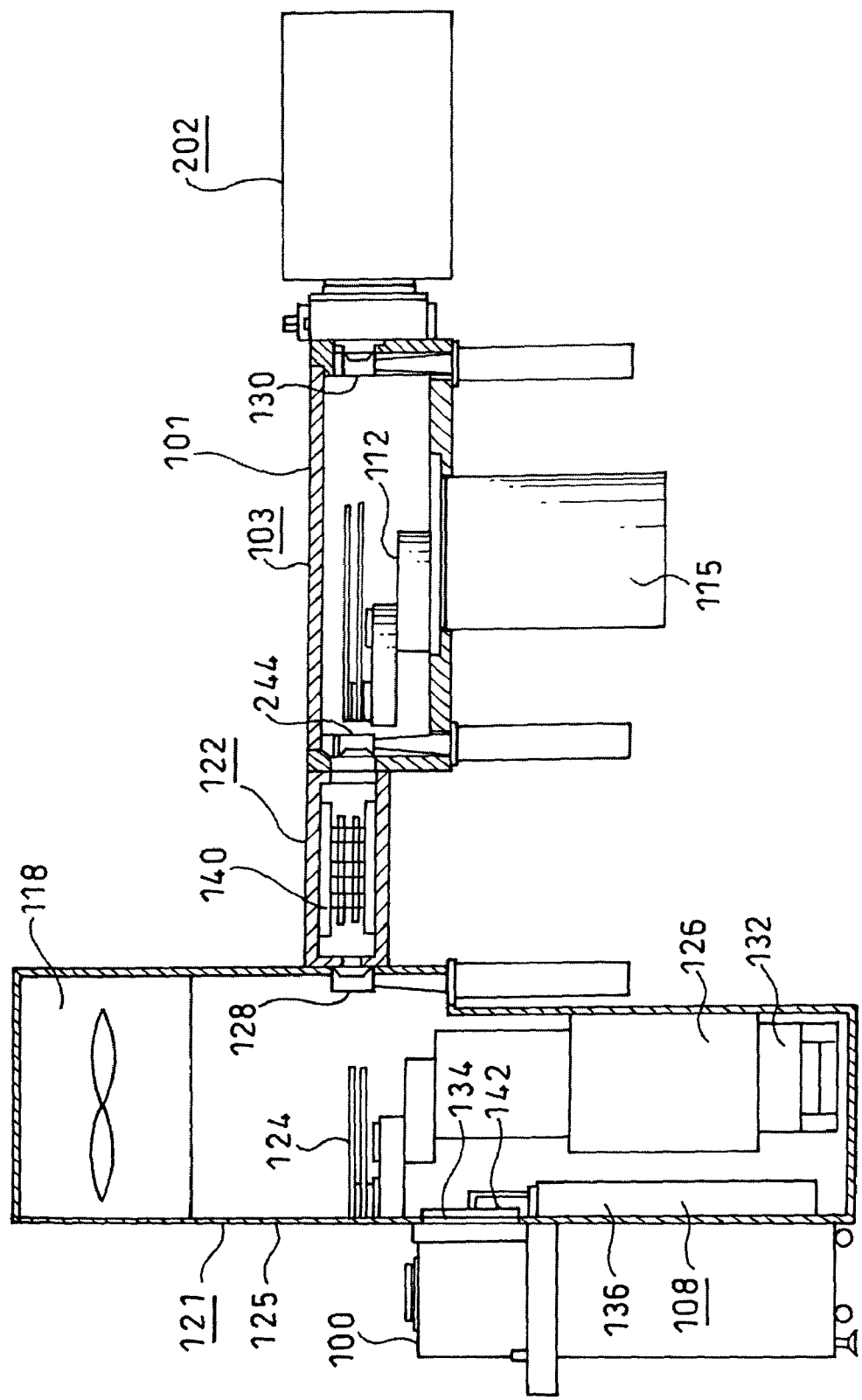
FIG. 2 is a schematic vertical sectional view for explaining the substrate processing apparatus according to the preferred embodiments of the present invention.

FIG. 1 is a schematic transverse sectional view for explaining a substrate processing apparatus of the preferred embodiments of the present invention. FIG. 2 is a schematic vertical sectional view for explaining the substrate processing apparatus of the preferred embodiments of the present invention.

An outline of the substrate processing apparatus of the preferred embodiments of the present invention will be explained with reference to FIGS. 1 and 2.

The substrate processing apparatus to which the present invention is applied uses an FOUP (front opening unified pod, pod hereinafter) as a carrier which carries a substrate such as a wafer. In the following explanation, forward, backward, leftward and rightward are based on FIG. 1. That is, with respect to the paper sheet on which FIG. 1 is shown, a front is a downside of the paper sheet, rear is an upside of the paper sheet, and left and right are left and right of the paper sheet.

As shown in FIGS. 1 and 2, the substrate processing apparatus includes a first transfer chamber 103 which has a structure of a load lock chamber capable of enduring a pressure (negative pressure) lower than an atmospheric pressure such as vacuum state. A casing 101 of the first transfer chamber 103 is formed into a hexagonal box-like shape as viewed from above, and upper and lower ends thereof are closed. A first wafer loader 112 which loads wafer 200 under a negative pressure is disposed in the first transfer chamber 103. The first wafer loader 112 can be vertically moved by an elevator 115 while keeping the hermeticity of the first transfer chamber 103.

An auxiliary chamber 122 for loading and an auxiliary chamber 123 for unloading are connected to two of six sidewalls of the casing 101 located on the front side through gate valves 244 and 127, respectively. Each of the auxiliary chamber 122 and the auxiliary chamber 123 has a structure of a load lock chamber capable of enduring negative pressure. A substrate placing stage 140 for a loading chamber is disposed in the auxiliary chamber 122. A substrate placing stage 141 for an unloading chamber is disposed in the auxiliary chamber 123.

A second transfer chamber 121 used under substantially the atmospheric pressure is connected in front of the auxiliary chamber 122 and the auxiliary chamber 123 through gate valves 128 and 129. A second wafer loader 124 for loading a wafer 200 is disposed in the second transfer chamber 121. The second wafer loader 124 is vertically moved by an elevator 126 disposed in the second transfer chamber 121, and is reciprocated in the horizontal direction by a linear actuator 132.

As shown in FIG. 1, a notch or an orientation flat aligning device 106 is disposed in the left side of the second transfer chamber 121. As shown in FIG. 2, a clean unit 118 which supplies clean air is disposed in an upper portion of the second transfer chamber 121.

As shown in FIGS. 1 and 2, pod openers 108 and wafer loading/unloading openings 134 for loading the wafers 200 into and unloading the wafers 200 from the second transfer chamber 121 are disposed at the front side of a casing 125 of the second transfer chamber 121. An IO stage 105 is disposed on the opposite side of the pod openers 108 with respect to the wafer loading/unloading openings 134, i.e., outside the casing 125. Each of the pod openers 108 includes a closure 142 which opens and closes a cap 100a of the pod 100 and which can close the wafer loading/unloading opening 134, and a driving mechanism 136 which drives the closure 142. By opening and closing the cap 100a of the pod 100 placed on the IO stage 105, the wafer 200 can be transferred into and from the pod 100. The pod 100 is supplied to and discharged from the IO stage 105 by a rail guided vehicle (RGV) (not shown).

As shown in FIG. 1, a first processing furnace 202 and a second processing furnace 137 which subject wafers to desired processing are adjacently connected to two of six sidewalls of the casing 101 located on the rear side (back side) through gate valves 130 and 131, respectively. Both the first processing furnace 202 and second processing furnace 137 are cold wall type processing furnaces. A first cleaning unit 138 and a second cleaning unit 139 are connected to remaining two of six sidewalls of the casing 101 which are opposed to each other. The first cleaning unit 138 and the second cleaning unit 139 cool the wafer 200 after processing.

Next, a processing step using the substrate processing apparatus having the above-described structure will be explained.

The pod 100 in which unprocessed 25 wafers 200 are accommodated is transferred into the substrate processing apparatus which carries out the processing step by the rail guided vehicle. As shown in FIGS. 1 and 2, the transferred pod 100 is passed from the rail guided vehicle and placed on the IO stage 105. The cap 100a of the pod 100 is detached by the pod opener 108 and a wafer in/out opening of the pod 100 is opened.

When the pod 100 is opened by the pod opener 108, the second wafer loader 124 disposed in the second transfer chamber 121 picks up the wafer 200 from the pod 100 and loads the wafer 200 into the auxiliary chamber 122, and moves the wafer 200 onto the substrate placing stage 140. During this loading operation, the gate valve 244 of the auxiliary chamber 122 on the first transfer chamber 103 side is closed, and the negative pressure in the first transfer chamber 103 is maintained. When the loading operation of a predetermined number of wafers 200, e.g., 25 wafers 200 accommodated in the pod 100 onto the substrate placing stage 140 is completed, the gate valve 128 is closed, and the auxiliary chamber 122 is evacuated to a negative pressure by an exhausting device (not shown).

If the pressure in the auxiliary chamber 122 becomes equal to a preset pressure value, the gate valve 244 is opened, and the auxiliary chamber 122 and the first transfer chamber 103 are in communication with each other. Next, the first wafer loader 112 of the first transfer chamber 103 picks up the wafer 200 from the substrate placing stage 140 and loads the wafer 200 into the first transfer chamber 103. After the gate valve 244 is closed, the gate valve 130 is opened, and the first transfer chamber 103 and the first processing furnace 202 are in communication with each other. Next, the first wafer loader 112 loads the wafer 200 into the first processing furnace 202 from the first transfer chamber 103, and moves the wafer 200 onto a support tool in the first processing furnace 202. After the gate valve 130 is closed, a processing gas is supplied into the first processing furnace 202 and the wafer 200 is subjected to desired processing.

When the processing of the wafer 200 in the first processing furnace 202 is completed, the gate valve 130 is opened, and the processed wafer 200 is unloaded to the first transfer chamber 103 by the first wafer loader 112. After the unloading, the gate valve 130 is closed.

The wafer 200 unloaded from the first processing furnace 202 is transferred to the first cleaning unit 138 by the first wafer loader 112, and the processed wafer 200 is cooled.

When the processed wafer 200 is transferred to the first cleaning unit 138, the first wafer loader 112 loads a wafer 200 which is previously prepared on the substrate placing stage 140 in the auxiliary chamber 122 into the first processing furnace 202 in the same manner as described above, and the wafer 200 is subjected to desired processing in the first processing furnace 202.

If a preset cooling time has elapsed in the first cleaning unit 138, the cooled wafer 200 is transferred to the first transfer chamber 103 from the first cleaning unit 138 by the first wafer loader 112.

After the cooled wafer 200 is transferred from the first cleaning unit 138 to the first transfer chamber 103, the gate valve 127 is opened. The first wafer loader 112 transfers the wafer 200, which is transferred from the first cleaning unit 138, to the auxiliary chamber 123, and places the wafer 200 on the substrate placing stage 141. After that, the auxiliary chamber 123 is closed by the gate valve 127.

By repeating the above-described operation, a predetermined number of wafers, i.e., 25 wafers 200, which are loaded into the auxiliary chamber 122, are sequentially processed.

When the processing of all of the wafers 200 loaded into the auxiliary chamber 122 is completed and all of the processed wafers 200 are accommodated in the auxiliary chamber 123 and the auxiliary chamber 123 is closed by the gate valve 127, the pressure in the auxiliary chamber 123 is returned to substantially the atmospheric pressure by an inert gas. If the pressure in the auxiliary chamber 123 is returned to substantially the atmospheric pressure, the gate valve 129 is opened, and the cap 100a of an empty pod 100 disposed on the IO stage 105 is opened by the pod opener 108. Then, the second wafer loader 124 in the second transfer chamber 121 picks up the wafer 200 from the substrate placing stage 141, and unloads the wafer 200 to the second transfer chamber 121 to accommodate the wafer 200 in the pod 100 through the wafer loading/unloading opening 134 of the second transfer chamber 121. If the accommodating operation of the processed 25 wafers 200 into the pod 100 is completed, the cap 100a of the pod 100 is closed by the pod opener 108. The closed pod 100 is transferred to a next step from the IO stage 105 by the rail guided vehicle.

The above-described operation is explained based on the case in which the first processing furnace 202 and the first cleaning unit 138 are used, but the same operation is carried out also when the second processing furnace 137 and the second cleaning unit 139 are used. Although the auxiliary chamber 122 is for loading of wafers and the auxiliary chamber 123 is for unloading of wafers in the above-described substrate processing apparatus, the auxiliary chamber 123 may be for loading of wafers and the auxiliary chamber 122 may be for unloading of wafers.

The first processing furnace 202 and the second processing furnace 137 may carry out the same processing or different processing. If the first processing furnace 202 and the second processing furnace 137 carry out the different processing, the wafers 200 may be subjected to certain processing in the first processing furnace 202 and then, the wafers 200 may be subjected to another processing in the second processing furnace 137, for example. When the wafer 200 is subjected to certain processing in the first processing furnace 202 and then the wafer 200 is subjected to another processing in the second processing furnace 137, the wafer 200 may pass through the first cleaning unit 138 or second cleaning unit 139.

Figure 3:
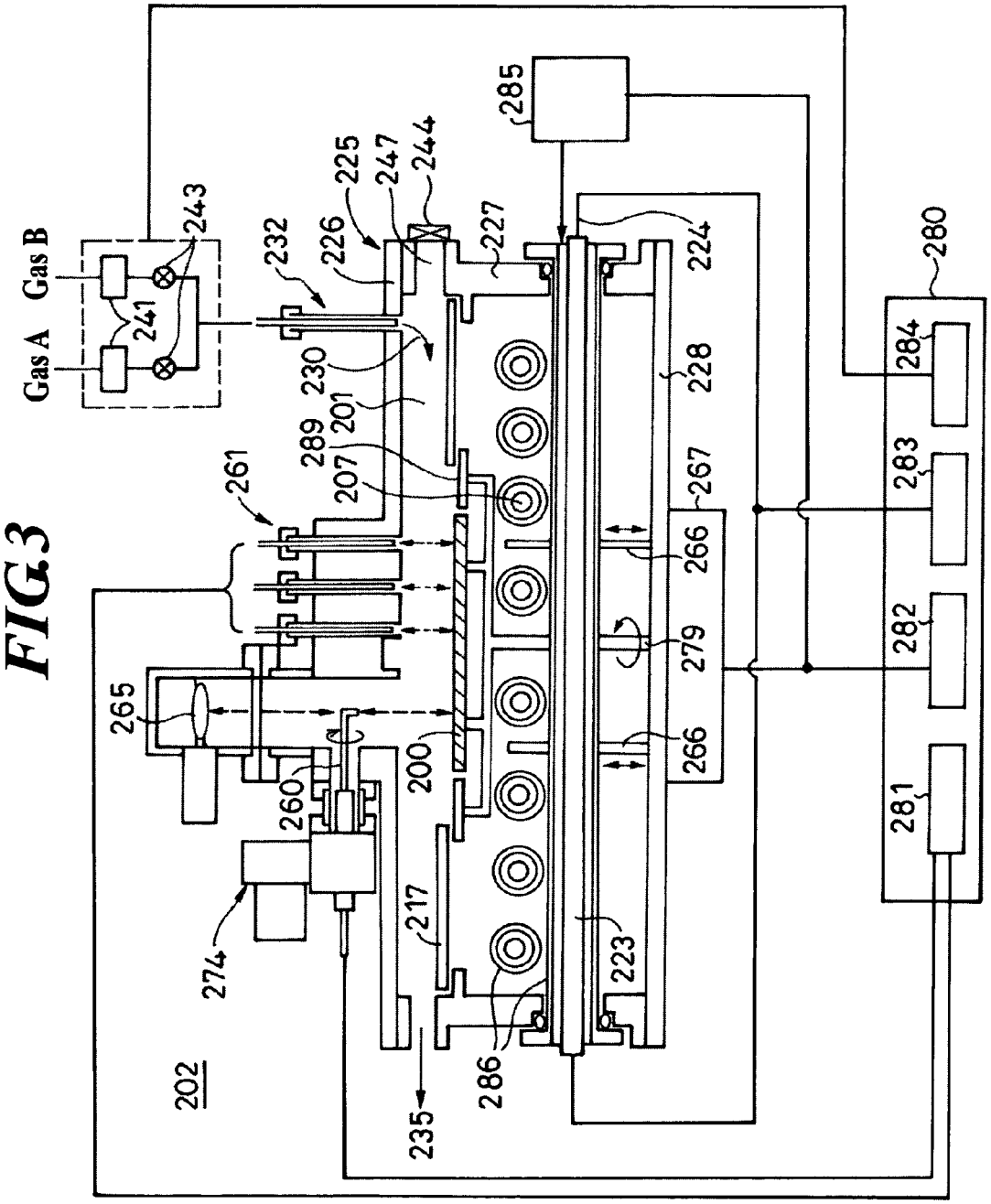
FIG. 3 is a schematic vertical sectional view for explaining a processing furnace of the substrate processing apparatus according to the preferred embodiments of the present invention.

FIG. 3 is a schematic vertical sectional view for explaining the processing furnace of the substrate processing apparatus of the preferred embodiments of the present invention. The processing furnace suitably used in the present embodiments will be explained in detail with reference to FIG. 3.

The substrate processing apparatus suitably used in the present embodiments includes a main control section 280 as a main controller. The main control section 280 controls operations of various parts constituting the substrate processing apparatus and the processing furnace.

The main control section 280 mainly includes a temperature detecting section 281, a driving control section 282, a heating control section 283, and a gas control section 284 which are controlled by the main control section 280.

The entire processing furnace is denoted by a reference number 202. In the illustrated embodiment, the processing furnace 202 is a single wafer type processing furnace which is suitable for carrying out various processing steps for substrates 200 such as semiconductor wafers (wafers, hereinafter). The processing furnace 202 is especially suitable for thermal processing of the semiconductor wafers. Examples of the thermal processing are thermal annealing of semiconductor wafers in processing of semiconductor devices, thermal reflowing of glass made of boron-phosphorus, and chemical vapor deposition for forming a thin film such as a high temperature oxide film, a low temperature oxide film, a high temperature nitride film, dope polysilicon, non-dope polysilicon, silicon epitaxial, a tungsten metal or tungsten silicide film.

The processing furnace 202 includes heater assembly comprising a plurality of upper side lamps 207 and lower side lamps 223. The heater assembly applies radiant heat to the wafer 200 such that the temperature of the substrates becomes substantially uniform. In the preferred embodiments, the heater assembly includes heating elements such as a series of tungsten halogen linear lamps 207 and 223 which supply intensive heating profile. The intensive heating profile irradiates with a radiation peak at 0.95 microns, forms a plurality of heating zones, and applies higher heat to a periphery of a substrate than a center of a wafer.

Electrodes 224 are connected to the upper side lamps 207 and the lower side lamps 223 to supply electricity to each of the lamps. The heating intensity of each lamp is controlled by the heating control section 283.

Each of the upper side lamps 207 and the lower side lamps 223 is covered with a quartz tube body 286, and the tube body 286 is air-tightly fixed to the chamber main body 227 by a sealing member such as an O-ring. Air-cooling gas is supplied into a space between the tube body 286 and each lamp from an air-cooling gas blower 285 which is controlled by the driving control section 282 to prevent the temperature of the outer side of the lamp from increasing and to maintain a predetermined temperature. The chamber main body 227 can be made of various metal materials. For example, aluminum is suitable in several applications, and stainless steel is suitable for other applications. Materials are selected in accordance with a kind of chemical materials used for processing such as annealing and chemical vapor deposition, and in accordance with reaction of the chemical materials with respect to the selected metal. The chamber wall is normally cooled to about 45 to 47 degrees Fahrenheit by a circulating cold water flow system which is known in this technical field.

The wafer 200 is held by a support pin 279 (made of quartz for example) together with a soaking ring 289 (made of suitable material such as graphite coated with silicon carbide, quartz, silicon pure carbide, alumina, zirconia, aluminum and steel for example) provided on an outer periphery of the wafer 200.

On the side of an outer periphery of the soaking ring 289, a doughnut-shaped flat lightproof plate 217 (made of silicon carbide for example) is supported by the chamber main body 227 such as to cover an upper face of the soaking ring 289.

The support pin 279 is rotatable by a driving mechanism 267 which is controlled by the driving control section 282. The rotation speed is set to an appropriate value in accordance with each processing, but it is preferable that the rotation speed is about 5 to 60 rpm.

The processing furnace 202 includes a chamber 225 comprising the chamber main body 227, a chamber lid 226 and a chamber bottom 228, and forms a processing chamber 201 with a space surrounded by the chamber 225.

A gas supply tube 232 penetrates the chamber lid 226 so that a processing gas 230 can be supplied to the processing chamber 201. The gas supply tube 232 is connected to a gas source for a gas A and a gas B through on-off valves 243 and mass flow controllers (MFC, hereinafter) 241 which are flow rate control means. A gas used here is desired gas such as an inert gas such as argon and nitrogen, hydrogen, and tungsten hexafluoride.

The on-off valves 243 and the MFC 241 are controlled by the gas control section 284 so that supply, stop of gas and a flow rate of gas are controlled.

The processing gas 230 supplied from the gas supply tube 232 is used for desired processing of the wafer 200 in the processing chamber 201, and a remaining gas is exhausted outside the processing chamber through an exhausting device comprising a vacuum pump or the like (not shown) from a gas exhaust opening 235 which is an exhaust opening provided in the chamber main body 227.

A wafer loading/unloading opening 247 which is opened and closed by the gate valve 244 is provided in the chamber main body 227 on the opposite side of the exhaust opening 235 so that the wafer 200 can be loaded into and unloaded from the processing chamber 201.

The processing furnace 202 includes a non-contact type emissivity measuring device (emissivity measuring means) for measuring emissivity of the wafer 200 and calculating a temperature of the wafer in various producing steps. This emissivity measuring means mainly includes an emissivity measuring probe 260, an emissivity measuring reference lamp 265, the temperature detecting section 281, and an optical fiber communication cable which connects the probe 260 and the temperature detecting section 281. It is preferable that this optical fiber communication cable is made of sapphire.

The probe 260 can be rotated by a probe rotation mechanism 274, and a tip end of the probe 260 can be oriented to the wafer 200 or a reference lamp 265 which emits reference light. Since the probe 260 is slip-coupled to the optical fiber communication cable, even if the probe 260 rotates as described above, the connection state is maintained.

That is, the probe rotation mechanism 274 rotates the emissivity measuring probe 260 so that the direction of the probe 260 can be changed between a first position where the tip end of the probe 260 is oriented substantially upward (i.e., toward the emissivity measuring reference lamp 265) and a second position where the tip end of the probe 260 is oriented substantially downward (i.e., toward the wafer 200). Therefore, it is preferable that the tip end of the probe 260 is oriented to a direction perpendicular to the rotation axis of the probe 260. In this manner, it is possible to detect a density of photon radiated from the reference lamp 265 and a density of photon reflected from the wafer 200. It is preferable that the reference lamp 265 comprises a white light source which radiates light having a wavelength in which transmittance of light in the wafer 200 becomes minimum, preferably, light having a wavelength of 0.95 microns. The emissivity measuring means described above measures the temperature of the wafer 200 by comparing the radiation from the reference lamp 265 and the radiation from the wafer 200.

Since the lightproof plate 217, the soaking ring 289 and the wafer 200 are provided between the heater assembly and the emissivity measuring probe 260, it is possible to suppress the influence of reading error of the emissivity measuring probe 260 caused by the heater assembly.

Next, a method of processing the wafer 200 will be explained as one of producing steps of a semiconductor device using the processing furnace 202 having the above-described structure.

The gate valve 244 which is a slice valve is opened, and the wafer (substrate) 200 is loaded into the processing chamber 201 through the wafer transfer in/out opening 247 formed in the chamber main body 227. The loaded wafer 200 is placed on wafer push-up pins 266 which are lifted by the driving mechanism (elevator means) 267. Then, the wafer push-up pins 266 are lowered by the driving mechanism 267, and the wafer 200 is placed on the support pin 279. After the wafer 200 is placed on the support pin 279, the support pin 279 and the wafer 200 are rotated by the driving mechanism (rotating means) 267 during the processing.

When measuring the emissivity of the wafer 200, the tip end of the probe 260 is rotated so that the tip end of the probe 260 is oriented toward the reference lamp 265 located directly above the wafer 200 (the first position), and the reference lamp 265 is lit. The probe 260 measures an incident photon density from the reference lamp 265. The probe 260 rotates from the first position to the second position while the reference lamp 265 is lit. While the probe 260 rotates, the probe 260 is oriented toward the wafer 200 located directly below the reference lamp 265. In this position, the probe 260 measures a reflection photon density of a device surface of the wafer 200 (a surface of the wafer 200). Then, the reference lamp 265 is put out. While the tip end of the probe 260 is oriented directly to the wafer 200, the probe 260 measures photon radiated from the heated wafer 200. According to the Planck's law, energy radiated to a certain surface relates to biquadratic of a surface temperature. A constant of proportion thereof is a product of a Stefan-Boltzmann constant and a surface emissivity. Therefore, when determining the surface temperature in a contactless method, it is preferable that the surface emissivity is used. A total hemispheric reflectivity of the device surface of the wafer 200 is calculated using the following equation, and the emissivity can be obtained by Kirchhoff's laws.

Wafer Reflectivity=Intensity of Reflected light/Intensity Intensity of Incident Light    (1)

Emissivity=(1−Wafer Reflectivity)    (2)

Once the emissivity of the wafer is obtained, a wafer temperature is obtained from the Planck's equation. This technique is also used when the wafer temperature is high and the basic heat radiation is subtracted before the above-described calculation is carried out in such application. It is preferable that the probe 260 stays in the second position, i.e., a position oriented to the wafer, and the probe 260 always keeps supplying the emissivity data when the reference lamp 265 is lit.

Since the wafer 200 is rotated, the probe 260 measures the photon density reflected from the device surface of the wafer 200 during the rotation, and measures the reflection from the average surface topology of the varying device structure which will be lithographed on the substrate. Since the emissivity is measured over the processing cycle including the thin film deposition process, an instantaneous variation in emissivity is monitored, and the temperature is corrected dynamically and continuously.

The processing furnace 202 further includes a plurality of temperature measuring probes 261 which are temperature detecting devices (temperature detecting means). These probes 261 are fixed to the chamber lid 226, and the probes 261 always measure the photon density radiated from the device surface of the wafer 200 under all of processing conditions. The wafer temperature is calculated by the temperature detecting section 281 based on the photon density measured by the probes 261, and the wafer temperature is compared with a set temperature by the main control section 280. As a result of the comparison, the main control section 280 calculates every deviation, and controls, through the heating control section 283, an amount of electricity supplied to a plurality of zones of the upper side lamps 207 and the lower side lamps 223 which are heating devices (heating means) in the heater assembly. Preferably, the processing furnace 202 includes three probes 261 positioned to measure temperatures of different portions of the wafer 200. This ensures uniformity of the temperature in the processing cycle.

The wafer temperature calculated by the temperature measuring probes 261 is compared with the wafer temperature calculated by the emissivity measuring probe 260 and corrected. With this, it is possible to detect a more precise wafer temperature.

While a desired processing gas 230 is supplied into the processing chamber 201 from the gas supply tube 232, the gas is exhausted from the gas exhaust opening 235 and the wafer 200 is subjected to desired processing.

After the wafer 200 is processed, the wafer 200 is pushed up from the support pin 279 by the plurality of push-up pins 266, and a space is formed below the wafer 200 so that the wafer 200 can automatically be unloaded in the processing furnace 202. The push-up pins 266 are vertically moved by the driving mechanism 267 under the control of the driving control section 282.

Next, the chamber 225 and the tube body 286 used in the preferred embodiments of the present invention will be explained.

The chamber 225 which heats the wafers is made of metal (e.g., stainless steel). A cooling operation is carried out using a cooling medium to prevent the temperature in the chamber 225 from increasing. However, a temperature difference occurs to some extent between an inner wall of the chamber which is directly irradiated with lamp light and an outer wall of the chamber. The temperature difference is about 80° C. to 200° C. depending upon the cooling efficiency and the lamp output. If the temperature of the chamber is uniform, the chamber is uniformly thermally expanded. If the temperature difference occurs, the chamber is deformed due to the difference in thermal expansion between the inner wall and the outer wall of the chamber. If the metal chamber has ductility and the deformation is within allowable stress, there is no problem.

In this embodiment, however, the chamber 225 is an assembly made of different materials, and has a hybrid structure in which the quartz tube body 286, which has smaller coefficient of thermal expansion and which is made of brittle material, is disposed. Therefore, even if the deformation of the metallic chamber 225 is within allowable stress, there is a possibility that a stress exceeding allowable value occurs in the quartz tube body 286 which is deformed together with the chamber 225 and the tube body 286 is broken.

In the present embodiments, by providing the substrate processing apparatus including: the chamber 225, made of a metal, to form the processing space for processing the wafer; the rod-like lamps 207, 223 which are at least one rod-like heating body for heating the wafer; and the tube bodies 286, made of a material different from that of the chamber 225 (quartz in this embodiment), to accommodate the rod-like lamps 207 and 223, the pressure in the quartz tube bodies 286 which are a brittle material can reliably be reduced and the temperature in the tube bodies 286 can reliably be increased without breaking the tube bodies 286 and without leakage therefrom.

Figure 4:
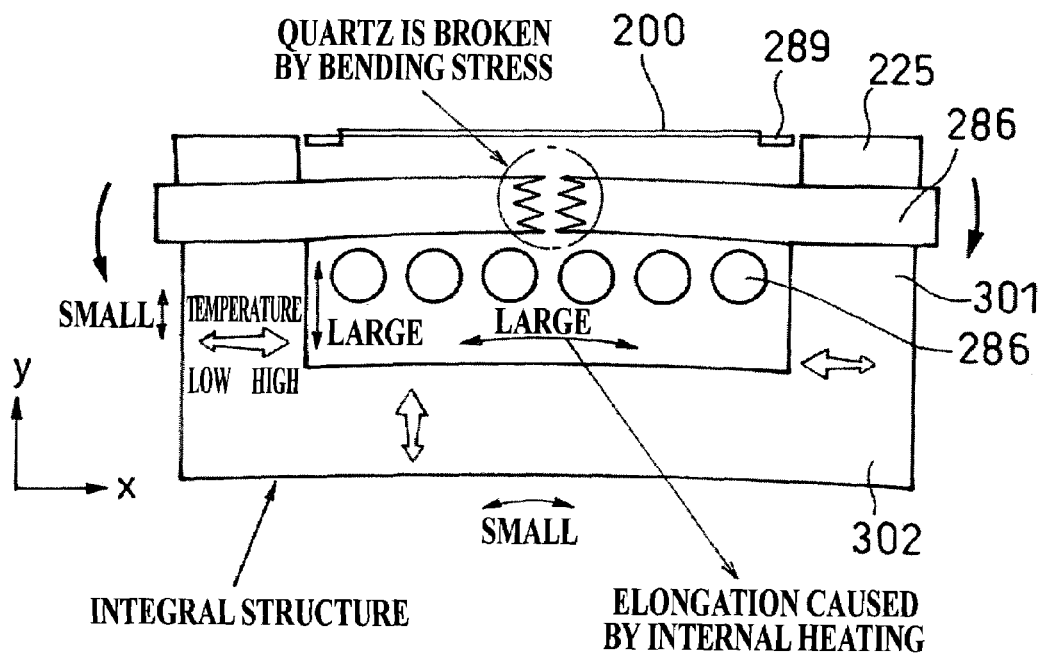
FIG. 4 is a schematic vertical sectional view for explaining a processing furnace of the substrate processing apparatus related to the preferred embodiments of the present invention.
Figure 5:
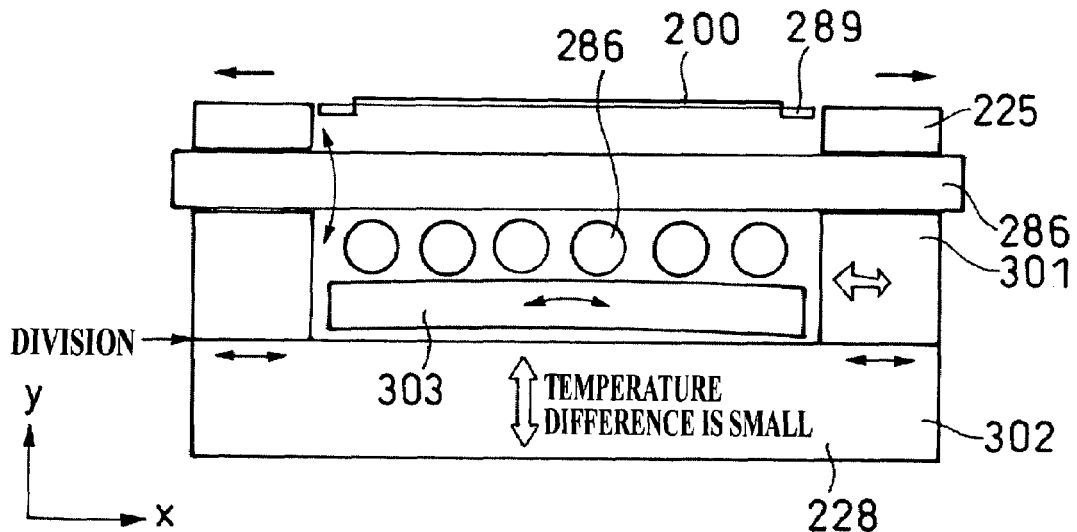
FIG. 5 is a schematic vertical sectional view for explaining the processing furnace of the substrate processing apparatus according to the preferred embodiments of the present invention.

For this purpose, a structure which suppresses the deformation of the chamber 225 in the bending direction owing to the temperature difference between the inner wall and the outer wall of the chamber 225 is employed. When a portion of the structure lower than a wafer heating surface (a wall surface which is directly heated by influence of lamp light) is taken into account, in the chamber 225 having a structure in which a side face and a bottom face of the chamber 225 are integrated as shown in FIG. 4, a deformation, in which a force in the bending direction of the quartz tube body 286 acts owing to the temperature difference between the inner wall and the outer wall, occurs. Hence, in this embodiment, as shown in FIG. 5, the chamber 225 is divided into a side block 301 and a bottom block 302 to moderate constraints of the side face and the bottom face in the twisting direction. A cooling plate 303 through which a cooling medium flows is disposed on the bottom block 302 to restrain the bottom block 302 from being heated.

Next, there is employed a structure which prevents the quartz tube bodies 286 from being broken by bending due to the temperature difference between the inner wall and the outer wall of the chamber 225.

Figure 6:
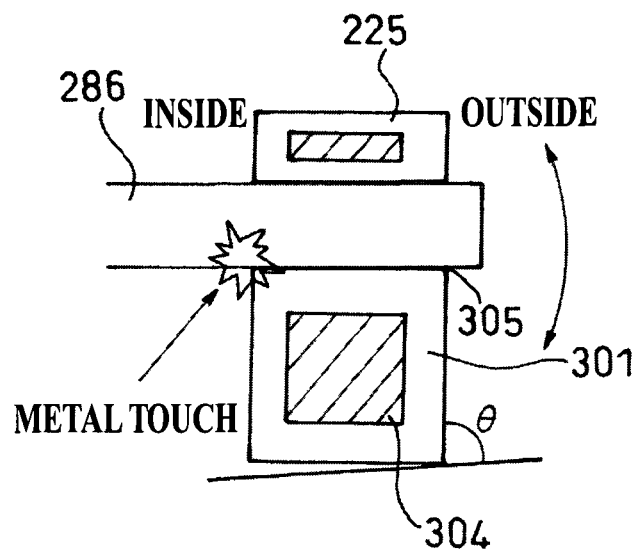
FIG. 6 is a schematic vertical sectional view for explaining a processing furnace of the substrate processing apparatus related to the preferred embodiments of the present invention.
Figure 8:
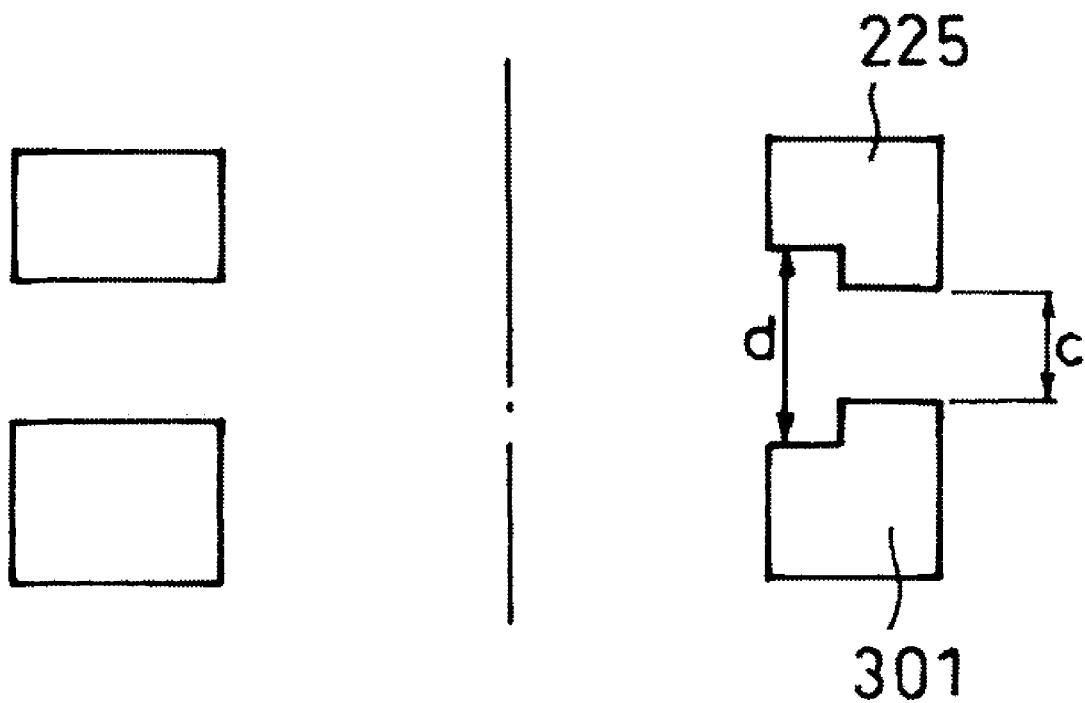
FIG. 8 is a schematic vertical sectional view for explaining a processing furnace of the substrate processing apparatus related to the preferred embodiments of the present invention.

The metal chamber 225 is cooled by a cooling medium to prevent its temperature from increasing. Since it is necessary to secure a cooling passage 304 also in the side of the chamber, the thickness of the side block 301 of the chamber 225 is increased. The chamber 225 is provided with a through hole 305 which penetrates a wall of the side block 301 of the chamber 225. The tube body 286 is inserted through the through hole 305, and the quartz tube body 286 is provided in the chamber 225, thereby the atmospheric pressure and vacuum are separated from each other. In this structure, the thicker the side block 301, the more likely the quartz tube body 286 and the through hole 305 formed in the side block 301 of the chamber 225 come into contact with each other because the side block 301 inclines at an angle of θ owing to the deformation of the chamber in the twisting direction as shown in FIG. 6. Hence, there is a possibility that this contact portion becomes a starting point of stress concentration and this portion is broken. As shown in FIG. 8, it is difficult to increase only a diameter of the through hole 305 on an inner wall side of the side block 301 of the chamber 225 owing to manufacturing constraints.

Figure 7:
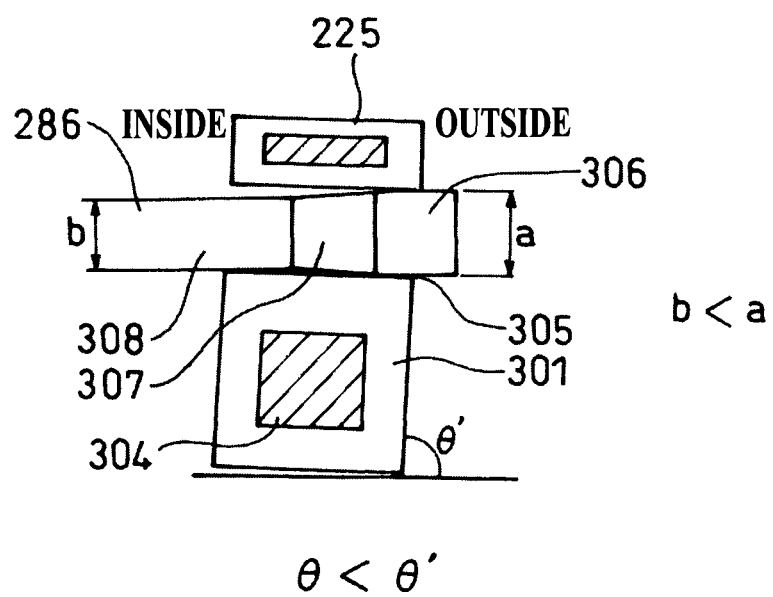
FIG. 7 is a schematic vertical sectional view for explaining the processing furnace of the substrate processing apparatus according to the preferred embodiments of the present invention.

Hence, in this embodiment, as shown in FIG. 7, an outer diameter "b" of the tube body 286 on the side of the processing space in the through hole 305 is set to be smaller than an outer diameter "a" of the tube body 286 on the outer side of the chamber in the through hole 305. Since the diameter of the quartz tube body 286 is set such that the outer wall side "a">the inner wall side "b", an allowable angle (θ') of inclination of the side block 301 until the quartz tube body 286 comes into contact with a metal (until the quartz tube body 286 comes into contact with the chamber 225 made of a metal) is increased (θ'>θ). This makes it possible to cope with deformation of the chamber 225 in the twisting direction. In this embodiment, the tube body 286 is divided into an outer wall side 306, a tapered portion 307 and an inner wall side 308 so that the outer diameter "a" of the outer wall side 306 is greater than the outer diameter "b" of the inner wall side 308.

This embodiment further employs a structure which suppresses stress concentration caused by the thermal expansion difference between a metal and quartz.

Figure 9:
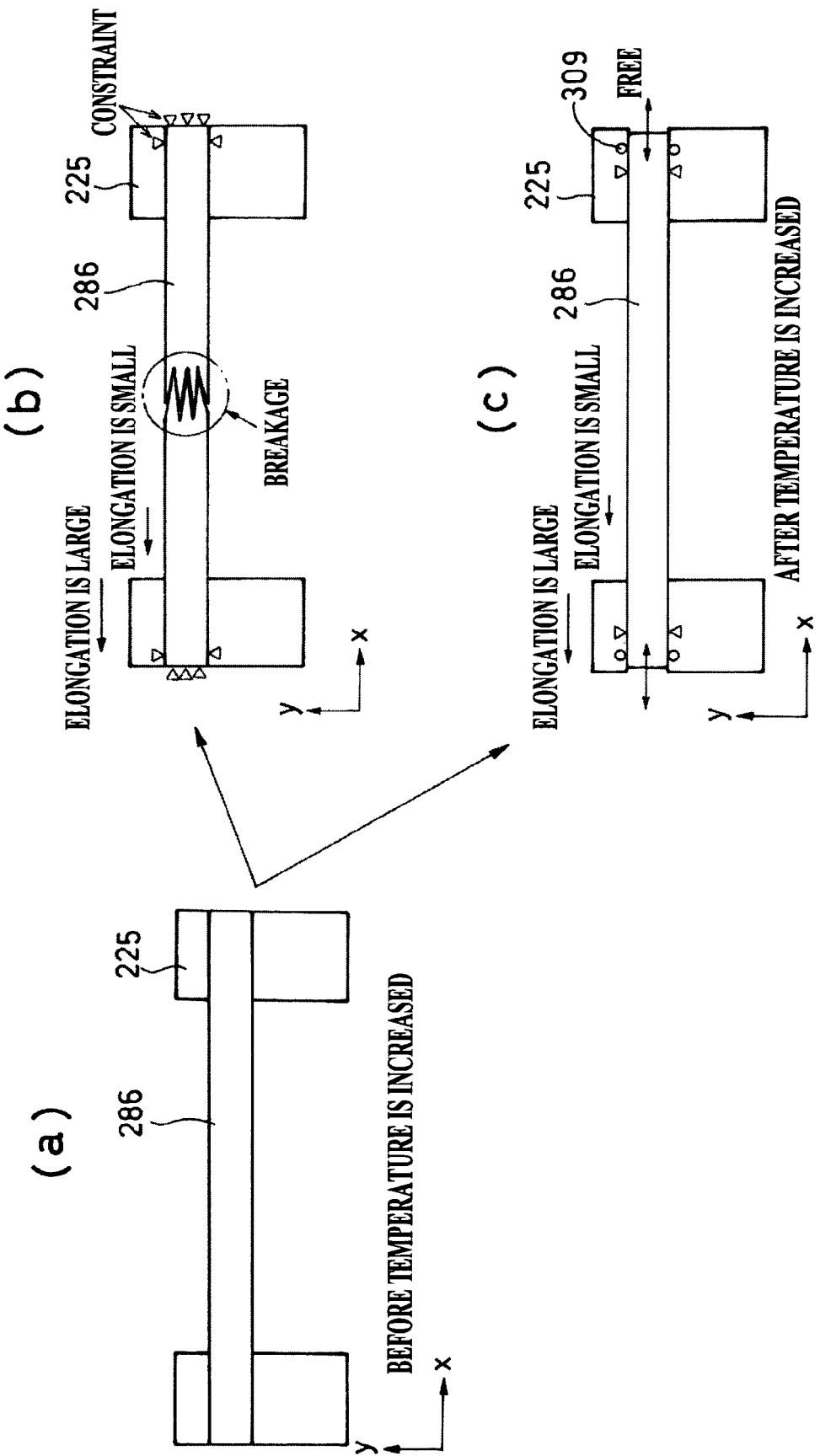
FIG. 9 is a schematic vertical sectional view for explaining the processing furnace of the substrate processing apparatus according to the preferred embodiments of the present invention.

As described above, even if the chamber 225 is divided into the side block 301 and the bottom block 302 and the deformation of the chamber 225 in the twisting direction is suppressed, the quartz tube body 286 is deformed outward (in the direction x) owing to the thermal expansion difference between a metal and quartz as shown in FIGS. 9(b) and (c) when the temperature is increased. If the quartz tube body 286 is completely constrained in all directions in this state as shown in FIG. 9(b), a stress exceeding the allowable value is generated in the tube body 286 made of quartz which has a smaller coefficient of thermal expansion than that of a metal and which is a brittle material, thereby the tube body 286 is broken.

In this embodiment, a constraint in the direction x is moderated to prevent the stress concentration caused by difference in elongation. As shown in FIG. 9(c) for example, O-rings 309 are provided in a circumferential direction of the quartz tube body 286. This structure makes it possible to moderate the constraint in the direction x and maintain the vacuum sealing performance, thereby to prevent leakage and breakage of quartz.

As described above, according to the present embodiments, it is possible to prevent metal contamination, and to enhance the lifetime of the lamps by separating the lamps 207 and 223 from the chamber atmosphere using the quartz tube body 286. Moreover, because the lamps 207 and 223 are separated from the chamber atmosphere by means of the tube body 286 instead of a plate, the thickness is reduced, and a distance between wafer 200 and filaments of the lamps 207 and 223 can be shortened. With this structure, the efficiency can be enhanced and energy can be saved. Furthermore, by dividing the chamber 225 into the side block 301 and the bottom block 302, it is possible to suppress the deformation of the chamber 225 in the twisting direction, and to prevent the quartz tube body 286 from being broken. Further, by setting the diameter of the quartz tube body 286 such that the outer wall side "a" is greater than the inner wall side "b", it is possible to prevent the quartz tube body 286 from being broken.

The entire disclosures of Japanese Patent Application No. 2005-345873 filed on Nov. 30, 2005 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

As explained above, according to the preferred embodiments of the present invention, by providing a substrate processing apparatus including a chamber, made of a metal, to form a processing space for processing a substrate; at least one rod-like heating body to heat the substrate; and a tube body, made of a material different from that of the chamber, to accommodate the heating body therein, wherein the tube body penetrates a wall of the chamber, it is possible to prevent the tube body from being broken.

As a result, the present invention can suitably be utilized especially for a semiconductor wafer processing apparatus which processes a semiconductor wafer, and for a producing method of a semiconductor device using the semiconductor wafer processing apparatus.

The invention claimed is:

1. A substrate processing apparatus, comprising:
a chamber, made of a metal, to form a processing space for processing a substrate;
at least one rod-like heating body to heat the substrate; and
a tube body, made of a material different from that of the chamber, to accommodate the heating body therein, wherein
an outer diameter of the tube body on a processing space side in a penetrating portion where the tube body penetrates a wall of the chamber is set to be smaller than an outer diameter of the tube body on an outer side of the chamber in the penetrating portion.

2. The substrate processing apparatus according to claim 1, wherein the chamber is divided into a side block and a bottom block.

3. The substrate processing apparatus according to claim 2, wherein the side block is formed with a cooling passage through which a cooling medium flows.

4. The substrate processing apparatus according to claim 2, wherein a cooling plate in which a cooling medium flows is disposed on the bottom block between the tube body and the bottom block.

5. The substrate processing apparatus according to claim 1, wherein an O-ring is provided in a circumferential direction of the penetrating portion.

6. The substrate processing apparatus according to claim 1, wherein the tube body is made of quartz.

7. The substrate processing apparatus according to claim 1, wherein in each of both ends of the tube body, a tapered portion is provided between an outer wall side of the chamber and an inner wall side of the chamber to allow the outer diameter of the tube body on the inner wall side to be smaller than the outer diameter of the tube body on the outer wall side.

8. A producing method of a semiconductor device, comprising:
loading a substrate into a processing space of a substrate processing apparatus including: a chamber, made of a metal, to form a processing space for processing a substrate; at least one rod-like heating body to heat the substrate; and a tube body, made of a material different from that of the chamber, to accommodate the heating body therein, wherein an outer diameter of the tube body on a processing space side in a penetrating portion where the tube body penetrates a wall of the chamber is set to be smaller than an outer diameter of the tube body on an outer side of the chamber in the penetrating portion;
heating the processing space by the heating body accommodated in the tube body;
processing the substrate in the processing space; and
unloading the substrate from the processing space.

* * * * *